United States Patent [19]

Quisenberry et al.

[11] Patent Number: 5,561,981
[45] Date of Patent: Oct. 8, 1996

[54] HEAT EXCHANGER FOR THERMOELECTRIC COOLING DEVICE

[76] Inventors: Tony M. Quisenberry, 67 Remington Dr., Highland Village, Tex. 75067; Roger S. DeVilbiss, 4401 Caruth Blvd., Dallas, Tex. 75225

[21] Appl. No.: 307,329

[22] Filed: Sep. 16, 1994

Related U.S. Application Data

[63] Continuation-in-part of Ser. No. 131,712, Oct. 5, 1993.

[51] Int. Cl.$^6$ .................................................. F25B 21/02
[52] U.S. Cl. ................................. 62/3.7; 62/3.5; 165/133
[58] Field of Search ............................... 62/3.2, 3.7, 3.5, 62/3.64, 259.3; 165/133, 185

[56] References Cited

U.S. PATENT DOCUMENTS

| | | | |
|---|---|---|---|
| 2,416,152 | 2/1947 | Braun | 165/185 |
| 2,713,655 | 7/1955 | Grubman | 165/185 |
| 3,626,704 | 12/1971 | Coe | 62/3.2 |
| 3,732,919 | 5/1973 | Wilson | 165/110 |
| 4,301,658 | 11/1981 | Reed | 62/3.7 X |
| 4,478,277 | 10/1984 | Friedman et al. | 165/185 |
| 4,583,583 | 4/1986 | Wittel | 165/46 |
| 5,035,052 | 7/1991 | Suzuki et al. | 29/890.046 |
| 5,097,829 | 3/1992 | Quisenberry | 128/400 |
| 5,128,517 | 7/1992 | Bailey et al. | 219/506 |
| 5,172,689 | 12/1992 | Wright | 128/400 |
| 5,174,121 | 12/1992 | Miller | 62/3.7 |
| 5,190,032 | 3/1993 | Zacol | 128/400 |
| 5,197,294 | 3/1993 | Galvan et al. | 62/3.62 |
| 5,279,128 | 1/1994 | Tomatsu et al. | 62/3.4 |

FOREIGN PATENT DOCUMENTS

| | | | |
|---|---|---|---|
| 4036210 | 5/1992 | Germany | 62/3.7 |
| 0188855 | 11/1982 | Japan . | |

*Primary Examiner*—Henry A. Bennett
*Assistant Examiner*—William C. Doerrler
*Attorney, Agent, or Firm*—Jenkens & Gilchrist, P.C.

[57] ABSTRACT

Heat exchangers for a thermoelectric cooling (TEC) device. A heat dissipation assembly comprises an array of foil corrugations disposed in generally parallel spaced relationship with the heat dissipation plate of the TEC. The array of foil corrugations includes at least an inner and an outer bank of foil corrugations and at least one plate sandwiched therebetween and secured thereto by vacuum brazing thereacross. In this manner, heat conductivity is maximized for transfer of heat thereacross and from the TEC to the outer bank. A heat absorption assembly for use with the TEC comprises a thermal transfer plate having a teflon coated, serpentine fluid conduit therein facilitating the flow of a variety of fluids to be cooled therethrough without contamination thereof.

24 Claims, 4 Drawing Sheets

HEAT EXCHANGER FOR THERMOELECTRIC COOLING DEVICE

The present application is a Continuation-in-Part of co-pending U.S. application Ser. No. 08/131,712 filed Oct. 5, 1993.

BACKGROUND OF THE INVENTION

1. Field of the Invention

The present invention relates to heat exchangers and, more particularly, to a thermoelectric cooling device heat exchanger incorporating an improved assembly to remove heat from a cooling fluid without contamination thereof.

2. History of the Prior Art

The development of thermoelectric cooling (TEC) devices has revolutionize the cooling industry. Conventional cooling has typically required the expansion and compression of gases, such as Chloroflorocarbons (CFC's) and Hydrochloroflorocarbons (HCFC's) to effect the absorption of heat for lowering the temperature of a fluid flowing in association therewith. Unfortunately, these substances are damaging to the earth's ozone layer and are being phased out in future years. The development of solid state cooling systems in the form of TEC devices, has permitted small commercial packages to be developed that are capable of precise temperature control in a variety of applications where environmental concern, size, weight, performance, and noise are at issue.

The most typical TEC device incorporates a thermoelectric module/component that utilizes electrical current to absorb heat from one side of the module and dissipate the heat on the opposite side. Heat exchangers are used on each side; the "heat-dissipating" side carrying heat away from the TEC device for maximizing efficiency and the "heat absorbing" side which lowers the temperature of a select material or fluid. If the current direction is reversed, so is the heat pumping. Generally, cold sides and hot sides are developed necessitating an effective means of removing or adding heat from or to a solid, liquid or a gas (typically air).

An example of such an application of a TEC device is seen in U.S. Pat. No. 5,097,829 (the '829 patent) for a temperature controlled cooling system. In this embodiment, the advantages of medically therapeutic cooling of a wound site on a body are discussed. Recent clinical evidence indicates that if the temperature of a body part, particularly a wound site, is lowered a number of therapeutic benefits ensue. First, a lower temperature will reduce swelling and increase the activity of the blood in the wound area to promote healing. Second, a lower temperature at a wound site substantially reduces the pain experienced by the patient. This not only increases the comfort level of the patient but significantly reduces the necessity for the administration of narcotics and other pain medication to the patient's benefit. Third, reduction of the temperature at a wound site increases the flexibility in that region. This is particularly true in the case of a traumatized joint or at the installation site of an artificial joint, where a lower temperature will greatly increase the ability of the patient to exercise the joint. Such treatment can substantially reduce the required period of stay in the hospital.

Initial use of cooling therapy was mainly found in the field of orthopedics. It is now found that post surgical cooling is highly beneficial in the reduction of trauma to the patient. It also increases the rate of healing and reduces the length of a hospital stay. In addition, cooling therapy is also being used in home health care for chronic pain control and to increase joint flexibility and facilitate the rate of healing.

Numerous non TEC prior art devices have been proposed for reducing the temperature of a body part in order to achieve the beneficial results obtained thereby. For example, ice packs have long been used to reduce swelling and achieve some of these benefits. In addition, cold packs containing two chemicals, which when mixed together absorb heat (endothermic reactions), have also been proposed as have cooling pads through which a cooling fluid is circulated and cooled by means of a compressor and refrigerant condensing in evaporator coils. Such devices are very inconvenient and contain many inherent disadvantages.

More recently, devices for circulating a cooling fluid through a blanket applied to a patient have also been proposed. Examples of such structures are shown in U.S. Pat. No. 3,894,213 to Kumar, and U.S. Pat. No. 3,967,627 to Brown, and U.S. Pat. No. 4,459,468 to Bailey. The Bailey patent discloses an apparatus which employs a fluid reservoir for containing a substantial volume of cooling fluid, the temperature of which is regulated by thermal modules. The temperature of the fluid in the reservoir is monitored to maintain a selected temperature. The fluid is pumped from the reservoir through a hose system to a thermal blanket which is applied to the patient and back into the reservoir for further cooling. While such a system has been popular in medical applications, it includes numerous disadvantages. For example, a reservoir system, such as that found in Bailey, requires a substantial pre-cooling time in order to reduce the temperature of the relatively large mass of fluid in the reservoir to a desired temperature level. Secondly, such fluid reservoir type systems must also be primed or go through a priming cycle before use to ensure that there is sufficient fluid in the reservoir before performing the cooling operation. Thirdly, the temperature of the reservoir fluid must be monitored and used as the control parameter. This leads to extreme inaccuracy in attempts to maintain a precise control over the temperature applied directly at the wound site. The heat gained by the fluid between a fluid reservoir and a thermal blanket may often be reflected by a temperature increase as much as 10 to 15 degrees. This results in a very inaccurate regulation of the actual temperature at the wound site.

Another problem associated with the applications of very cold surfaces, such as that of an ice pack, directly to a body part is its effect on the skin. The temperature of the ice pack is very cold and can only be left against the skin for a short period of time. Generally, leaving it longer than 30 minutes can result in damage to the skin. It is much more desirable to be able to apply a temperature in a range between 50 and 55 degrees, which is relatively comfortable to the skin, and maintain that temperature for a substantial number of days. This prolonged application insures that the body part is cooled to the inner depth of the bone or tissue of the traumatized area. With an ice pack, cooling only takes place in the subdural area. In a more precisely controlled temperature application, cooling can take place at a deep penetration for an extended period. Thus, it is highly desirable to be able to maintain precise control of the temperature which is actually contacting the tissue of a wound site and then sustain that temperature for a substantial period of time. In this manner the advantages obtained from the use of cold therapy in a medical application can be vastly increased. This is accomplished with TEC devices as shown in the '829 patent. An improvement is shown in co-pending patent application Ser. No. 08/131,712, from which this application is a continuation-in-part. The heat absorbing heat exchanger for fluid/liquid cooling described in the above-referenced co-pending patent application is critical to the system, as is the heat exchanger for removing thermal energy from the TEC device. Likewise, the type of material utilized in the fluid/liquid heat exchanger may vary. It has been found that aluminum has certain advantages over materials such as stainless steel and the like. Aluminum is light weight, more thermally conductive than stainless steel and is much less expensive. For this reason, it is preferable as a component in the heat absorbing heat exchanger for cooling select fluids.

The use of aluminum as a material for the heat absorbing heat exchanger for fluid cooling does present certain problems. Clear fluid such as deionized water is often used in such cooling systems. Deionized water, when flowing across aluminum, can become contaminated with aluminum molecules, reducing the purity of the water causing it to become more conductive. This is a marked disadvantage in operational systems requiring a high degree of purity. For example, cooling systems of the type described in the above-referenced co-pending application may be used for cooling lasers and the like. The absence of an electrical conductor between the cooler and the laser is therefore important. When the deionized water is contaminated with aluminum molecules, the liquid becomes more electrically conductive and problems may ensue. For this reason, it would be an advantage to improve such systems by preventing aluminum contamination of the cooling fluid.

The present invention provides such an improvement over the prior art by utilizing a teflon coating over the serpentine channels of an aluminum heat absorbing heat exchanger. In this manner, not only is deionized water isolated from the aluminum, but other chemicals that could react with aluminum, such as acid baths, can be pumped through the cooling system. With the utilization of teflon, the problem is virtually eliminated. These advantages can be provided with an improved heat dissipating heat exchanger for the TEC device. The heat dissipating heat exchanger is constructed with a plurality of banks of corrugated foil members sandwiched between adjacent metal plates, the assembly being secured in thermal and mechanical contact with the TEC device by vacuum brazing or the like. The vacuum brazing permits the thermal functioning structure to approach that of a unitary construction whereby thermal gradients across junctures between plates (lamella) and foil and the foil corrugations are substantially reduced. The reduction of thermal gradients, the optimal use of cool air flow and the heat sink surface area improve the heat dissipation capacity of the heat exchanger and provides a compact, low weight heat dissipating heat exchanger in conjunction with the improved design of the heat absorbing heat exchanger.

SUMMARY OF THE INVENTION

The present invention relates to TEC heat exchangers. More particularly, one aspect of the present invention comprises a fluid flow, heat absorbing heat exchanger for a thermoelectric cooling (TEC) device incorporating a teflon coated fluid flow passage. A heat dissipation heat exchanger is also provided with a plurality of corrugated foil members sandwiched between metal plates (lamella) that are vacuum brazed one to the other for improved mechanical and thermal contact therebetween. The fluid passage for the heat exchanger is teflon coated to prevent contamination of the fluid.

In another aspect of the invention, the above-described TEC device is used in conjunction with an improved temperature controlled fluid circulating system for automatically cooling a thermal blanket with a thermoelectric cooling module, the system being of the type where a temperature control fluid is cooled by the TEC device and pumped to, through and from the blanket through first and second conduits.

In yet another aspect, the above described present invention includes the above described heat exchanger that accommodates thermoelectric cooling modules with a ZT of less than or greater than 1.0. ZT is an index number which pertains to the temperature and figure of merit of the thermoelectric material.

In yet another aspect, the invention comprises an improved fluid flow heat exchanger for a TEC device of the type having oppositely disposed, generally planar plates, one of which absorbs heat energy and the other of which dissipates heat energy. The improvement comprises an array of foil corrugations having adjacent peaks in a generally coplanar configuration disposed contiguous to, and in generally parallel spaced relationship with, the heat dissipation plate. The array further includes at least 2 banks of foil corrugations and at least one plate sandwiched therebetween and secured to the foil corrugations along the corrugation peaks thereof for transferring heat thereacross from the inner bank to the outer bank. The improvement also includes the heat absorption heat exchanger being made of aluminum and including a serpentine fluid flow path that is teflon coated. In one aspect, the invention includes at least two TEC devices assembled oppositely one another in generally parallel spaced relationship for exposing the heat energy absorbing plates of each one to the heat absorbing heat exchanger.

In another aspect, the present invention includes an improved method of removing or adding heat from TEC modules utilizing vacuum or inert gas brazed folded fin heat dissipation heat exchangers in combination with a teflon coated, serpentine channel heat absorption heat exchanger. The heat dissipation heat exchanger is designed such that the cool air flow across the fin surface area is maximized due to the shorter length in the direction of air flow, so that temperature rises in the heat sink are minimized. Air flow to remove the heat from the folded fin heat exchangers may be provided by, but not limited to, cross flow blowers or radial fans that are configured such that the air is being pushed through the folded fin heat exchanger, pulled through the folded fin heat exchanger, or pushed then pulled through the heat exchanger.

Applications of the above mentioned inventive aspects include, but are not limited to, heat removal or temperature control of therapeutic pads, laser diodes, laser diode arrays, CO2 lasers, TiSapphire Lasers, air conditioning, dehumidification, plasma etch equipment, rotary evaporator cooling, general laboratory cooling, recirculating cooling for replacement of ice baths, and distillations.

BRIEF DESCRIPTION OF THE DRAWINGS

For a more complete understanding of the present invention and for further objects and advantages thereof, reference may now be had to the following description taken in conjunction with the accompanying drawings in which.

DETAILED DESCRIPTION

Figure 1:
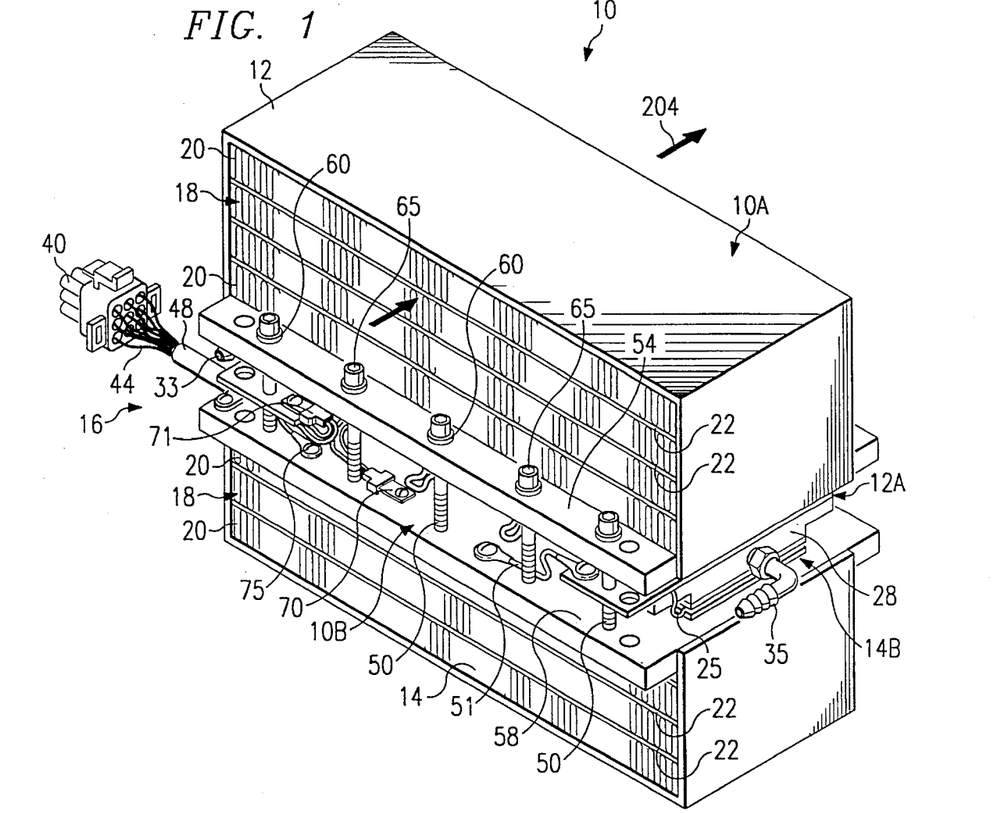
FIG. 1 is a perspective view of a thermoelectric cooling (TEC) device heat exchanger constructed in accordance with the principles of the present invention.

Referring first to FIG. 1 there is shown a perspective view of a thermoelectric cooling (TEC) device heat exchanger constructed in accordance with the principles of the present invention. The heat exchanger assembly 10, of this particular embodiment, comprises a heat dissipation heat exchanger 10A including an upper cooling bank 12 and lower cooling bank 14 sandwiching a TEC device array 16 therebetween. Each of the cooling banks 12 and 14 is constructed of corrugated foil 18 which is packaged and assembled into layers 20 separated by lamella 22. The degree of cooling required for each TEC device array 16 determines the size, shape, and number of layers 18 of the banks 12 and 14. Air flow 204 is provided to facilitate coolers, as described below.

Referring still to FIG. 1, the assembly 10 is constructed for maximizing the efficiency of the TEC device array 16 sandwiched therein. The TEC device array 16 is, in the present embodiment, comprised of a plurality of TEC devices 25 which are mounted on opposite sides of a heat absorption heat exchanger 10B including a serpentine channel liquid heat exchanger plate 28 adapted for absorption of heat from a liquid as described below. Only a portion of the exchanger plate 28 is shown in this particular view. What is shown is a pair of connectors 33 and 35 extending from the ends of the exchanger plate 28 for purposes of permitting the flow of liquid therethrough. A plug assembly 40 is shown to be connected to a series of wires 44 extending through a cable 48 connected to the series of TEC devices 25 sandwiched between the upper cooling bank 12 and lower cooling bank 14. As shown herein, the upper and lower cooling banks 12 and 14 are secured about the TEC device array 16 by a series of threaded fasteners 50. The threaded fasteners 50 extend from an upper flange 54 to a lower flange 58. The flanges 54 and 58 comprise portions of the heat conducting plates that are mounted to the TEC devices 25 as described below. Washers 60 are illustrated beneath fastening heads 65 of each of the threaded fasteners 50. Likewise a variety of electrical connections are shown secured to the plates 54 and 58 as described below.

Still referring to FIG. 1, the numerous wire connections shown therein provide a series of electrical connections for the operation of the TEC device array 16. Jumper 51, for example, provides a grounding connection for the upper heat exchanger plate 28. Connection 70 comprises an active temperature sensor for indicating the temperature of the lower flange 58. Connector 71 comprises a cold manifold temperature sensor for indicating the temperature of the heat exchanger plate 28. Wire 75 comprises a grounding lug for a portion of the TEC device array 16. Other conventional wiring connections will, of course, be necessary, and it may be seen that the electrical connection for this particular configuration may be modified in accordance with the principles of the present invention. Likewise the size and number of the TEC device array 16 may vary depending upon the cooling requirements of the system. In that regard, it may be seen that the TEC device array 16 is disposed in two sections about the heat exchanger plate 28 (shown most clearly in FIG. 2). A space 12A is defined between the upper cooling bank 12 and one side of heat exchanger plate 28 wherein a series of TEC devices 25 are sandwiched. Likewise a space 14A is formed between the lower cooling bank 14 and an opposite side of the heat exchanger plate 28 where a second series of TEC devices 25 are sandwiched. The spacing, configuration, electrical and thermal connection and related structural aspects will be discussed below.

Figure 2:
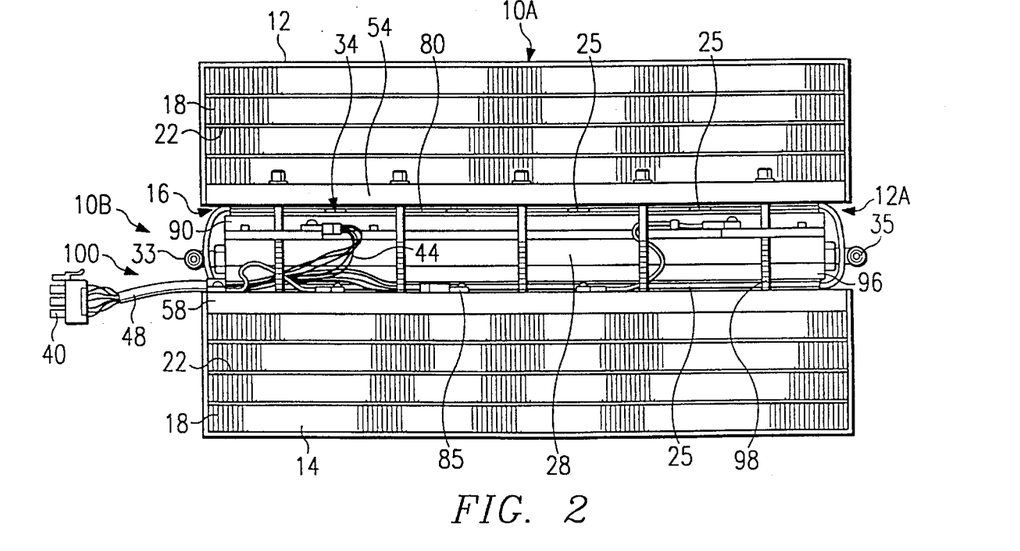
FIG. 2 is a side-elevational view of the thermoelectric cooling device heat exchanger of FIG. 1.

Referring now to FIG. 2 there is shown a side elevational view of the heat exchanger 10 of FIG. 1, wherein upper and lower cooling banks 12 and 14 are shown in a configuration more clearly illustrating the plurality of TEC devices 25 disposed therebetween to comprise a TEC device array 16. In this particular embodiment, the TEC device array 16 comprises (5) five TEC devices 25 disposed along space 12A above the top side 80 of exchanger plate 28 and (5) five TEC devices 25 disposed along space 14A on the lower side 85 of exchanger plate 28°. The liquid heat exchanger plate 28 is shown to be sandwiched between the upper and lower banks 12 and 14 with the thermal conductive plates 54 and 58 functioning as bulkheads relative thereto. The myriad of wires 44 shown extending from the cable 48 and connected to the plug 40 provide both power to the TEC device array 16 and the various sensors installed thereon, such as sensor 70 discussed above.

Referring still to FIG. 2, a teflon-coated serpentine liquid flow path is formed through the liquid heat exchanger plate 28 which is preferably made of aluminum. The oppositely disposed sides of thermally conductive exchanger plate 28 are then exposed to the TEC units 25 which are in flush engagement therewith. In that respect, an upper plate member 90 (also preferably of aluminum) of exchanger plate 28 is placed in direct contact with top array 94 of TEC devices 25 disposed beneath upper bank 12. A lower plate member 96 of the exchanger plate 28 is secured in direct contact with bottom array 98 of TEC devices 25 disposed above lower cooling bank 14. A substantially confined cooling region 100 is thus disposed between upper and lower banks 12 and 14, respectively, which cooling region 100 is defined by the TEC device array 16 and the exchanger plate 28 specifically adapted for the flow of liquid therethrough via the couplings 33 and 35.

Still referring to FIG. 2, the effectiveness of the present invention requires an appropriate thermal and mechanical bond within the cooling banks 12 and 14, particularly between the corrugated foil 18 and lamella 22. Such a bond is effected, in the present invention, by vacuum brazing. Brazing is the process by which metals are heated and joined together using a molten filler metal at temperatures generally in excess of 450° C. The filler metal can be in the form of foil, wire, filings, slugs, powered, paste or tape. Vacuum brazing eliminates the use of fluxes and oxidation, which may weaken the joint in the brazing process. In accordance with one embodiment of the principles of the present invention, the folded foil corrugations 18 are vacuum brazed in a furnace to the lamella 22 formed of horizontal aluminum plates. Multiple rows of folded foil corrugations 18 can be vacuum brazed providing more surface area for heat dissipation. In that regard, each cooling bank 12 and 14 includes the utilization of the aluminum plate 54 or 58, as described above, in association therewith for direct thermal engagement with the TEC device array 16. Appropriate thermal grease or the like may be utilized to further enhance the heat dissipation therethrough.

Figure 3:
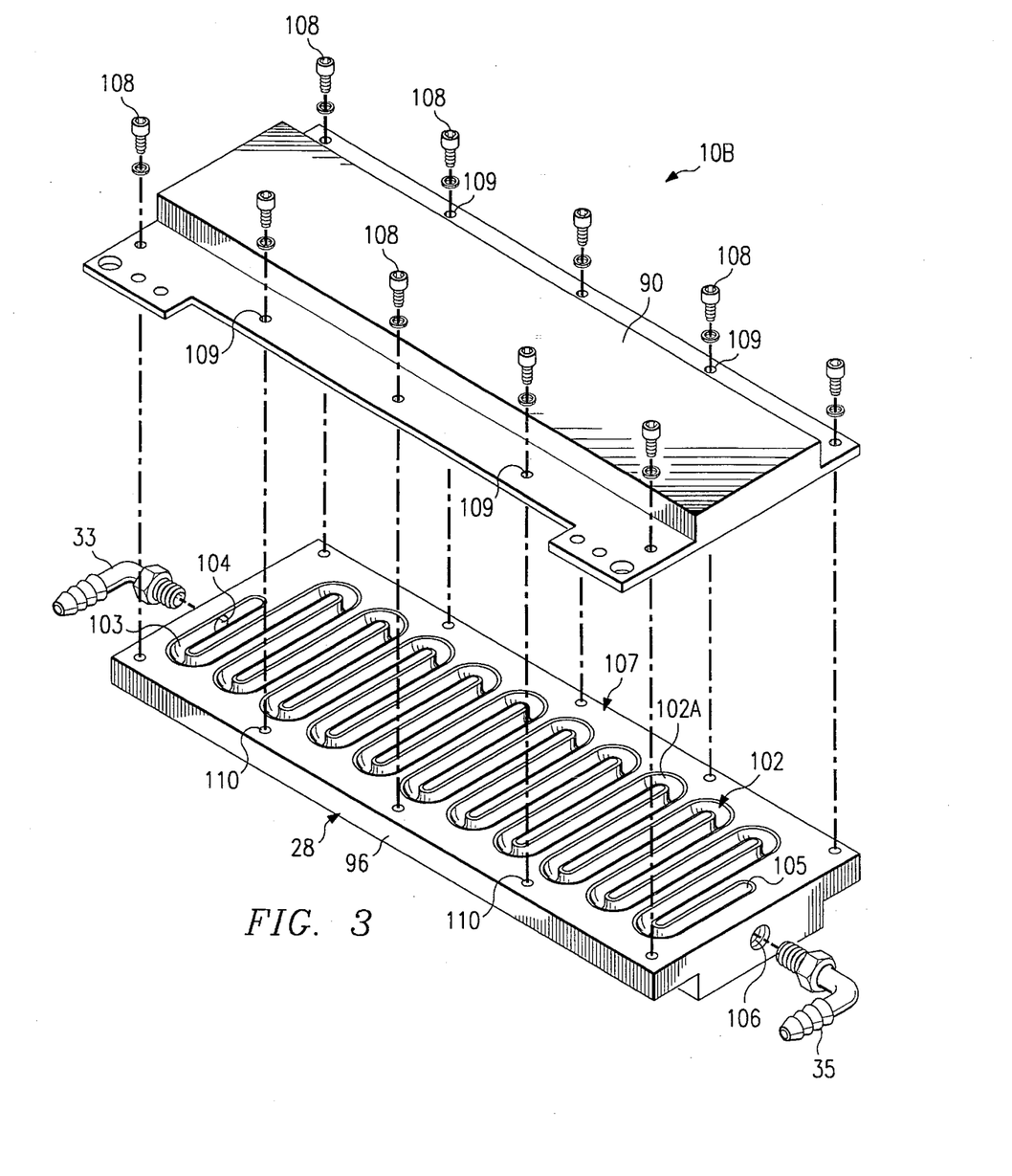
FIG. 3 is an enlarged, exploded perspective view of a portion of the thermoelectric cooling device of FIG. 1.

Referring now to FIG. 3, an exploded perspective view of the heat absorption heat exchanger 10B is shown wherein lower plate 96 and upper plate 90 are shown in more detail illustrating the serpentine fluid flow path 102 formed therein. The serpentine flow path 102 is shown to be integrally formed in the lower plate 96 in this particular embodiment. On a first end 103 an aperture 104 is provided for connecting to coupling 33 for the flow of liquid therein. Likewise, on end 105 an aperture 106 is formed for coupling to connector 35 for the discharge of liquid therefrom. A teflon coated serpentine pattern 107 is shown to be formed within the plate 96 in such a configuration to maximize the distance of flow of liquid through the channel 102. A plurality of fasteners 108 are shown to be utilized for securing the plates together in the configuration shown. In that regard, clearance apertures 109 are formed in the upper plate 90 while threaded apertures 110 are formed in lower plate 96. By fastening the two plates together, a closed teflon coated serpentine flow path 107 is provided for the sealed flow of liquid therethrough and the cooling thereof in accordance with the principles of the present invention.

Referring still to FIG. 3, the teflon coated serpentine flow path 102 is shown with teflon coating 102A therealong. The purpose of the teflon coating is to prevent the liquid flowing within the flow path 102 from being contaminated by the material of the heat exchanger plate 28. Stainless steel is often used in heat exchangers in order to reduce the level of contamination of fluid flowing therethrough. In the present application, it has been found preferable to utilize aluminum which is of lighter weight, less cost and more thermally conductive. Aluminum does, however, contaminate certain fluids flowing therethrough by virtue of the metallurgical stability of the material itself. Deionized water is often the preferable cooling fluid for many commercial applications of such cooling systems. Deionized water can be contaminated by aluminum molecules when flowing in direct contact with aluminum. For this reason, the teflon coating 102a has been applied to chemically isolate the liquid flowing within flow path 102 from the material of the heat exchanger. The teflon coating 102a is applied in a sufficiently thin layer so as to limit the degree of thermal insulation afforded thereby. In one embodiment, the coating is formed of DuPont teflon PFA in 0.003 to 0.004 inch thickness. The flow path 102 is coated with the PFA and the heat exchanger plate 28 cured at approximately 750° for 30 minutes. It has been noted that the elevated temperature may alter the temper of the aluminum in certain instances.

Figure 4:
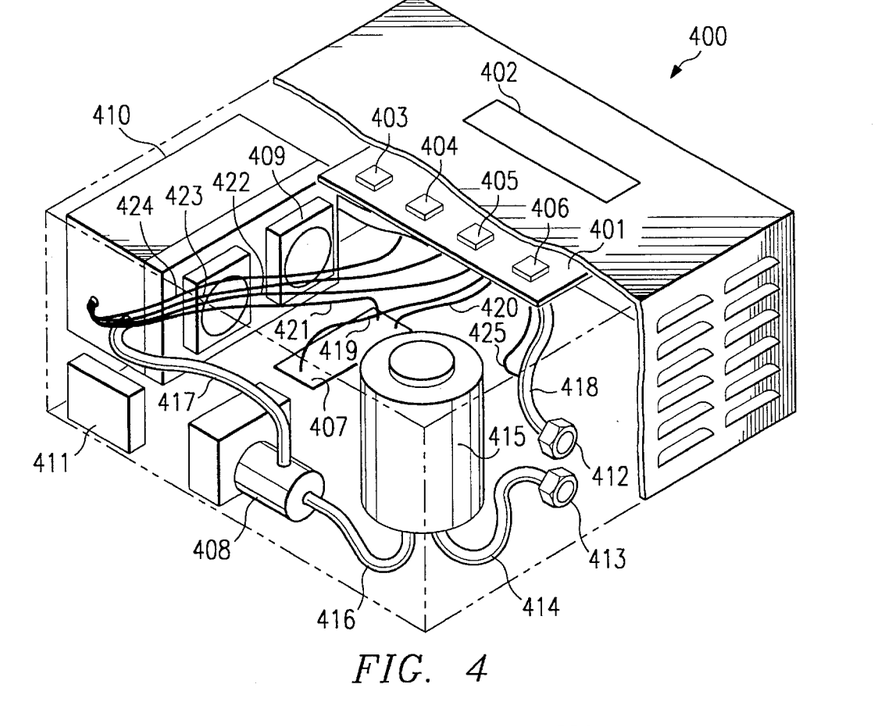
FIG. 4 is a perspective view of the thermoelectric cooling device heat exchanger of FIG. 1 shown in conjunction with a temperature control fluid circulating the system for use in a particular cooling application.

Referring now to FIG. 4, there is shown one example of a temperature controlled fluid circulating system which may be assembled in association with the TEC device array 16 described above. Consistent therewith, there is shown a perspective view of a temperature control fluid circulating system constructed in accordance with the teachings of U.S. Pat. No. 5,097,829 referenced above. The system shown in the '829 patent may be used for therapeutic purposes such as cold therapy applications as well as industrial purposes such as heat removal from lasers and the like. The system 400 includes a microprocessor based control card 401, comprising the heart of the control system, a LCD display 402, and user interface buttons for operator control. A button 403 is used, for example, to start and stop a pump 408. Buttons 404 and 405 may be used to increase or decrease the set-point temperature. Button 406 may be used to display the actual liquid temperature output on display 402. The control board 401 in this particular design interfaces with a pulse width modulation board 407 which provides the appropriate power to the particular TEC device assembly 410 of the types described above. Pump 408 then circulates the coolant to and from the external device being cooled. Fan(s) 409, shown herein, then force air across the folded fins of the cooling banks (not shown in this view but described above) removing the heat from the TEC device assembly 410. Power supply 411 then provides 15 Volt DC power for the control board 401 and pulse width modulator board 407.

For purposes of clarity, external hoses are not shown attached to the system 400 and reference is again made to the '829 patent which illustrates such hose connections. Connectors for such hoses are, however, shown. Outlet fitting 412 of the present embodiment is a leakless, quick connect fitting which provides coolant to the device being cooled. Inlet fitting 413 is a leakless, quick connect fitting which retrieves the coolant from the device being cooled. Return hose 414 sends the coolant to the reservoir 415 and the reservoir pump hose 416 sends the coolant from the reservoir 415 to the pump 408. Hose 417 sends the coolant from the pump to the cooling assembly 410. Hose 418 sends the coolant from the cooling assembly 410 to the outlet connection 412.

Addressing now particular aspects of the electronic control of system 400, wires 419 represent the TEC power control wires. Single lines may represent a plurality of wires for purposes of clarity. Wires 420 carry the power for the cooling assembly 410. Wires 421 comprise the pulse width modulated power wires for cooling assembly 410. Wires 422 comprise the TEC power return. Sensors (not shown in this view) provide the control board 401 with the manifold temperature signal carried by wire 423 and heat sink temperature signal carried by wire 424, respectively. Hose 425 is a pressure sensor hose. This example of a recirculating fluid system has applications in cold therapy as set forth in the '829 patent. The system 400 may also be used for heat removal from laser diodes, general laboratory cooling and a variety of other application where liquid cooling is needed. The system provides proportional pulse width controlled power to the thermoelectric modules as the cool ant is being pumped there through.

Figure 5:
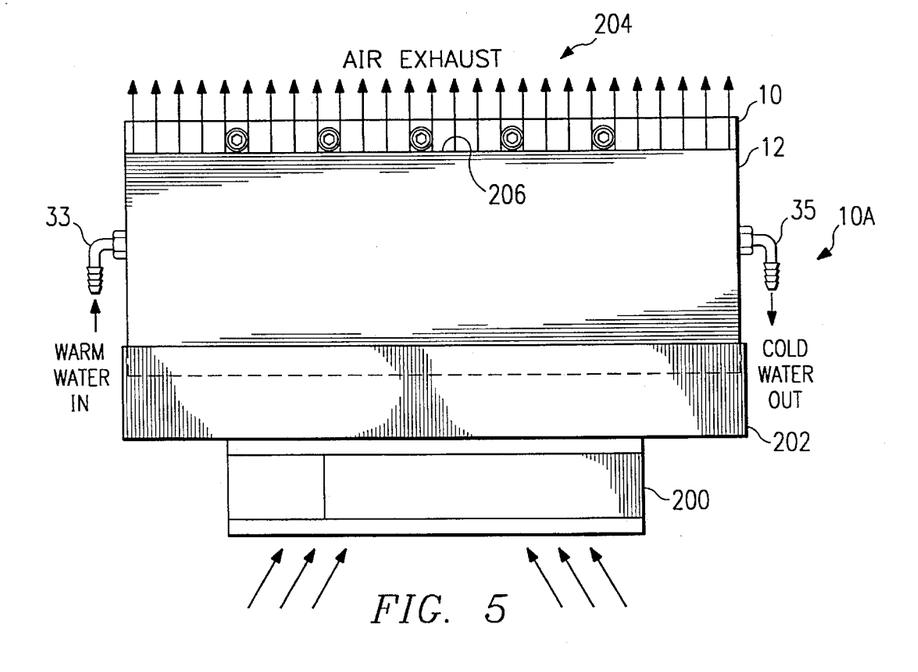
FIG. 5 is a top plan diagrammatic view of an alternative embodiment of the heat exchanger of the present invention illustrating a forced air flow therethrough.

Referring now to FIG. 5 there is shown an alternative embodiment of the heat dissipation heat exchanger 10A of the present invention illustrating the utilization of forced air produced by an axial fan 200 and air box 202 assembled in association with the upper and lower banks 12 and 14 thereof. In that regard, the assembly 10 is shown in a top plan view wherein upper bank 12 is illustrated disposed contiguous a diffuser air box 202 secured therearound for diffusing and directing the flow of air from fan 200 therethrough. Arrows 204 illustrated discharging from the opposite side 206 of the bank 12 representing the general uniform flow of air through the foil corrugations thereof illustrated in FIGS. 1 and 2. Cold water discharge outlet 35 and warm water inlet connector 33 are illustrated for reference purposes.

Figure 6:
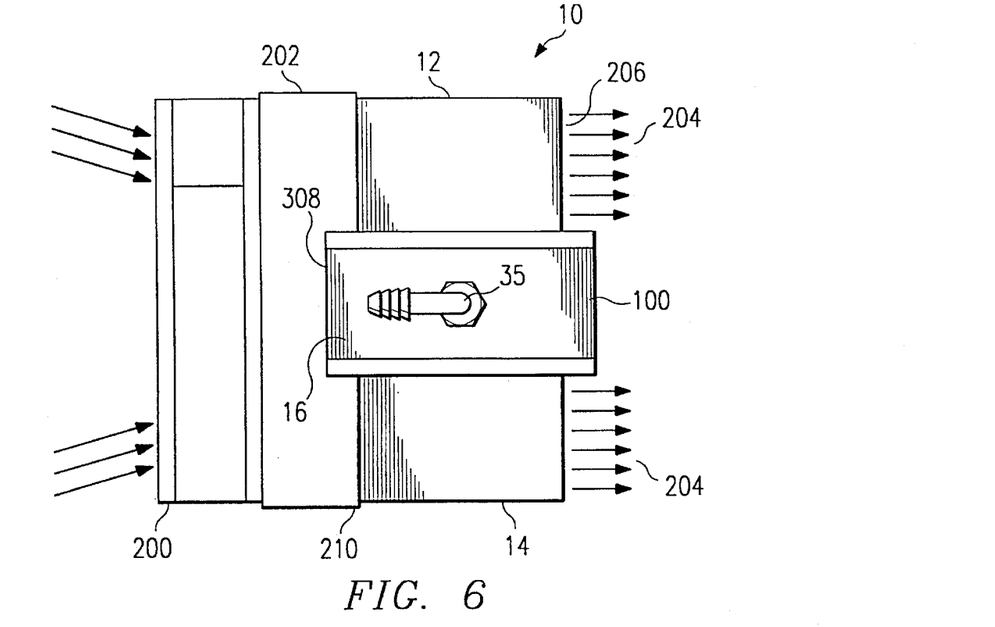
FIG. 6 is a side elevational view of the heat exchanger of FIG. 5.

Referring now to FIG. 6 there is shown a side elevational view of the assembly 10 of the present invention illustrating in more detail the utilization of the axial fan 200 in association therewith. The fan 200 is disposed adjacent the air box 202 which effectively diffuses the direct flow of air from fan 200 and imparts a uniform pressure along a side 210 of the upper and lower foil banks 12 and 14. In this way, the air 204 is permitted to pass through the foil corrugations illustrated in FIGS. 1 and 2 above and carry heat therefrom for discharge from the opposite end 206 thereof.

Figure 7:
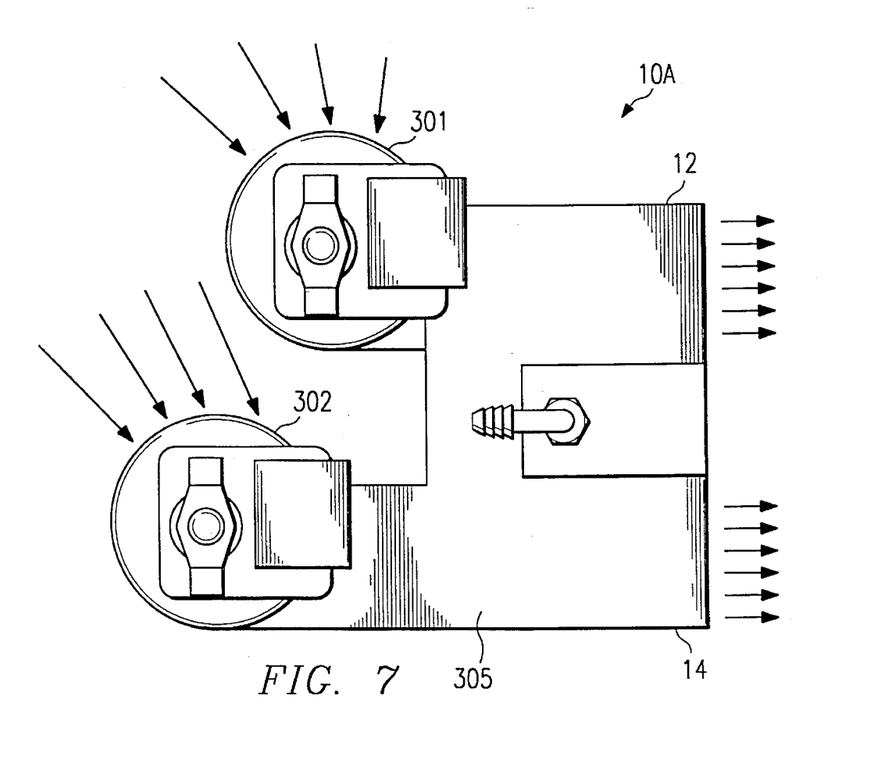
FIG. 7 is a side elevational diagrammatic view of an alternative embodiment of the heat exchanger of FIG. 6.

Referring now to FIG. 7 there is shown an alternative embodiment of a fan assembly constructed in accordance with the principles of the present invention. The heat dissipation heat exchanger 10A incorporates a top cross flow fan 301 and a second, lower cross flow fan 302. The cross flow fans provide an alternative forced air flow configuration which may be utilized for particular applications. Cross flow fans or blowers have certain advantages and disadvantages over axial fans of the type described above. What is shown in FIG. 7 is, however, an identical heat dissipation heat exchanger 10A with a modified diffuser housing 305 assembled thereto. The diffuser housing 305 is adapted for disposing the cross flow fans 301 and 302 adjacent one another in position for maximizing the flow of air through the respective cooling banks 12 and 14.

Referring now to FIGS. 6 and 7 in combination, advantages exist for both types of fans. A cross flow fan of the type shown in FIG. 7 provide an even distribution of air across individual heat exchanger cooling banks 12 and 14. Such fans are generally less noisy due to a more even air flow distribution. Cross flow fans are, however, more expensive and cause the overall package to increase in size. The advantages of axial fans of the type shown in FIG. 6 include a smaller size and less cost. The disadvantages of axial fans include increased noise levels of air flowing across the cooling banks 12 and 14 and less even air flow distribution across said cooling banks. It is important to note that the heat dissipation requirements, along with the criteria discussed above, will be the controlling factors in determining the type of fan to be utilized in accordance with the principles of the present invention. By utilizing such a configuration, it has been shown that each side of such a heat dissipation heat exchanger 10A can remove in excess of 350 watts. With an air flow of greater than 200 cfm, a heat sink resistance of 0.028° C./Watt or better can be achieved with such a design. With a stack design of two heat exchangers with one cold plate, the heat exchanger can dissipate over 700 watts of power to ambient.

Referring now to FIGS. 6 and 2 in combination, it may be seen that the flow of forced air through the cooling banks 12 and 14 requires isolation of the cooling region 100. Isolation and separation of the cooling region 100 is accomplished by the utilization of insulating foam. As shown by dotted lines 308 in FIG. 6, the presence of foam insulation is illustrated. One foam which has been utilized in accordance with the principles of the present invention is a polyurethane closed cell foam that minimizes moisture, dirt and dust contamination on the thermoelectrics or the wiring of the TEC device array 16. Generally, a conventional two part foam may be utilized with select areas masked off in a conventional fashion and the foam injected into the foam region. The foam around the TEC device array 16, as shown in FIG. 6 by the 308, isolates, effectively insulates and protects the TEC device array 16 and to further force all airflow through the cooling banks 12 and 14.

Referring back to FIG. 4, it may be seen that the heat exchanger 410 is generally described in conjunction with a therapeutic pad assembly of the type shown in the '829 patent. Applications of the present invention are not, however, limited to such therapeutic pads and may be used for laser diodes, laser diode arrays, CO2 lasers, TISapphire lasers, air conditioning, dehumidification, plasma etch equipment, rotary evaporated cooling, general laboratory cooling, recirculating cooling for replacement of ice baths and distillation and related applications.

Referring back to FIG. 2, the thermoelectric modules the individual TEC devices 25 are connected together through a unitary flexible circuit. This eliminates the use of multiple lead wire operations to connect each of the TEC devices in the TEC device array 16. The TEC devices 25 are placed in a fixture which holds the modules in an array exposing lead tabs such that a unitary flexible circuit can be placed on the tabs and soldered thereto and the flexible circuit is placed over them. The flexible circuit is soldered to the TEC devices 25 through either a hand operation or through a reflow oven.

The liquid heat exchanger plate 28, as described above, utilizes unidirectional flow of the fluid passing through it allowing temperature grading along the length of said liquid heat exchanger plate which provides a maximum cooling of the liquid.

It is thus believed that the operation and construction of the present invention will be apparent from the foregoing description. While the method and apparatus shown or described has been characterized as being preferred it will be obvious that various changes and modifications may be made therein without departing from the spirit and scope of the invention as defined in the following claims.

What is claimed is:

1. An improved heat exchanger for a thermoelectric cooling device of the type having oppositely disposed, generally planar plates, one of which absorbs heat energy and the other of which dissipates heat energy and of the type wherein heat conducting bodies are secured in thermal engagement with the heat dissipation and heat absorption plates of said thermoelectric cooling device, said heat conducting bodies being formed of a material which can chemically contaminate fluids flowing thereover and being adapted for facilitating the transfer of heat away from and to said plates of said thermoelectric cooling device for improving the efficiency of operation thereof, said improvement comprising a Teflon coated fluid passage formed in said heat conducting body secured against said heat absorption plate for facilitating the cooling of fluid therewith, while preventing the contamination thereof by the material of said heat conducting body, said Teflon coated fluid passage being comprised of a relatively thin coating of DuPont Teflon PFA for chemically isolating said fluid from said material of said heat conducting body, said coating having a thickness on the order of 0.003 to 0.004 inches therealong to improve thermal conductivity therethrough, and an array of foil corrugations having adjacent peaks in a generally coplanar configuration disposed contiguous to, and in generally parallel spaced relationship with, said heat conducting body secured against said heat dissipation plate, said array further including at least 2 banks of foil corrugations comprising inner and outer banks and at least one plate sandwiched therebetween and secured to said foil corrugations along the corrugation peaks thereof for transferring heat thereacross from said inner bank to said outer bank.

2. The apparatus as set forth in claim 1 wherein said foil corrugations comprise 0.5 mil thick aluminum folded into a corrugation array having side wall portions between opposite peaks, themselves aligned in generally parallel spaced relationship.

3. The apparatus as set forth in claim 1 wherein said plate is made of metal and mechanically engages said foil peaks evenly thereacross in thermal contact therewith.

4. The apparatus as set forth in claim 3 wherein said foil peaks are connected to said plates by vacuum brazing.

5. The apparatus as set forth in claim 4 wherein a second plate is secured by vacuum brazing to said outer bank along said peaks thereof.

6. The apparatus as set forth in claim 1 wherein at least two thermoelectric cooling devices are assembled opposite one another in generally parallel spaced relationship for exposing said heat energy absorbing plates of each one to the other for defining a cooling region therebetween.

7. The apparatus as set forth in claim 6 wherein each of said thermoelectric cooling devices is assembled to a heat dissipation heat exchanger, and wherein said banks of foil corrugations thereof are disposed in generally parallel spaced relationship.

8. The apparatus as set forth in claim 6 wherein said thermoelectric cooling devices are disposed on opposite sides of said teflon coated fluid passage for absorbing heat from a first fluid passing therethrough.

9. The apparatus as set forth in claim 8 wherein said teflon coatedd fluid passage comprises a portion of a cooling module of a temperature control fluid circulating system for automatically cooling a thermal blanket with said cooling module, said system being of the type wherein a temperature control fluid is cooled by said cooling module and pumped to, through, and from said blanket through first and second conduits, and said first fluid comprises said temperature control fluid.

10. The apparatus as set forth in claim 9 wherein said temperature control fluid circulating system comprises:
   means for powering said cooling module with pulse width modulated electrical signals;
   means for sensing the temperature of fluid flowing within at least one of said conduits;
   means coupled to said sensing means for calculating an indication of the temperature of said fluid within said blanket from said sensed temperature of said fluid within at least one of said conduits; and
   means associated with said powering means for modifying said indicated temperature of said fluid.

11. The apparatus as set forth in claim 9 wherein said temperature control fluid circulating system comprises a fan disposed adjacent said banks of foil corrugations, said fan being adapted for blowing air through said corrugations for transferring heat therefrom.

12. The apparatus as set forth in claim 11 wherein said fan is of a variable speed variety and means are provided for varying the speed of said fan to reduce noise and power.

13. A method of conducting heat away from a fluid with a fluid with a thermoelectric cooling device of the type having oppositely disposed, generally planar plates, one of which absorbs heat energy and the other of which dissipates heat energy, said method comprising the steps of:
   providing heat absorption and heat dissipation heat exchangers for said thermoelectric cooling device;
   securing said heat dissipation heat exchanger in mechanical and thermal engagement with the heat dissipation plate of said thermoelectric cooling device;
   securing said heat absorption heat exchanger in mechanical and thermal engagement with the heat absorption plate of said thermoelectric cooling device;
   said step of providing said heat dissipation heat exchanger including the steps of:
      forming an array of foil corrugations having adjacent peaks in a generally coplanar configuration,
      securing said array into a bank of corrugations for assembly to said thermoelectric cooling device,
      securing said bank to and in generally parallel spaced relationship with, said heat dissipation plate of said thermoelectric cooling device,
      providing a generally flat plate,
      mounting said plate to said peaks of said first bank,
      providing a second outer bank of foil corrugations, and
      mounting said second outer bank to said plate with said adjacent peaks of said outer bank in mechanical and thermal contact with said plate; and
   said step of providing said heat absorption heat exchanger including the steps of:
      providing a heat conducting body formed of a material which can chemically contaminate fluids flowing thereover for securement against said heat absorption plate,
      forming a fluid passage through said heat conducting body for facilitating the passage of fluid therethrough for the cooling thereof while preventing the contamination thereof by the material of said heat conducting body,
      coating said fluid passage with a relatively thin coating of DuPont Teflon PFA for chemically isolating said fluid from said material of said heat conducting body, said coating having a thickness on the order of 0.003 to 0.004 inches therealong to improve thermal conductivity therethrough, and
      mounting said heat conducting body against said heat absorption plate.

14. The method as set forth in claim 13 and further including the step of forming said foil corrugation with foil having a thickness on the order of 0.5 mils and the step of folding said aluminum into a corrugation array having side wall portions between opposite peaks aligned in generally parallel spaced relationship.

15. The method as set forth in claim 13 and further including the step of forming said plate of metal and the step of mechanically securing said foil peaks evenly and in thermal contact with said metal plate.

16. The method as set forth in claim 15 and further including the step of securing said metal plate to said foil peaks by vacuum brazing.

17. The method as set forth in claim 16 and further including the step of securing a second plate to said outer bank along said peaks thereof.

18. The method as set forth in claim 13 and further including the step of providing at least two thermoelectric cooling devices and assembling said devices opposite one another in generally parallel spaced relationship and the step of exposing said heat energy absorbing plates of each thermoelectric cooling device one to the other and defining a cooling region therebetween.

19. The method as set forth in claim 18 and further including the step of constructing at least two heat dissipation heat exchangers and assembling each of said thermoelectric cooling devices to one of said heat exchangers, and disposing said banks of foil corrugations of each of said heat exchangers in generally parallel spaced relationship one with the other.

20. The method as set forth in claim 18 and further including the step of disposing said coated fluid passage between said thermoelectric cooling devices in position for the absorption of heat from said Teflon coated fluid passage, and the step of passing a first fluid therethrough.

21. The method as set forth in claim 20 and further including the step of providing said teflon coated fluid passage as a part of a temperature control fluid circulating system for automatically cooling a thermal blanket with said cooling module, said system being of the type wherein a temperature control fluid is cooled by said cooling module and pumped to, through, and from said blanket through first and second conduits, and the step of providing said first fluid as said temperature control fluid and the step of passing said temperature control fluid between said thermoelectric cooling devices.

22. The method as set forth in claim 21 and further including the steps of:

powering said cooling module with pulse width modulated electrical signals;

sensing the temperature of fluid flowing within at least one of said conduits;

coupling said sensing means to means for calculating an indication of the temperature of said fluid within said blanket from said sensed temperature of said fluid within at least one of said conduits; and modifying said indicated temperature of said fluid in response to said calculation of said indication of said temperature of said fluid within said blanket.

23. The method as set forth in claim 21 and further including the step of providing a fan for forcing air in a given direction and disposing the fan adjacent said banks of foil corrugations, powering said fan for moving air therewith and flowing air with said fan through said corrugations for transferring heat therefrom.

24. The method as set forth in claim 23 and further including the step of providing said fan in a variable speed configuration and varying the speed of said fan to reduce noise and power in said system.

* * * * *